(12) United States Patent
Zhou et al.

(10) Patent No.: US 12,191,588 B2
(45) Date of Patent: Jan. 7, 2025

(54) FLEXIBLE PRINTED CIRCUIT BOARD AND ELECTRONIC DEVICE

(71) Applicant: HONOR DEVICE CO., LTD., Guangdong (CN)

(72) Inventors: Yawei Zhou, Shenzhen (CN); Fan Luo, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/004,165

(22) PCT Filed: Sep. 8, 2022

(86) PCT No.: PCT/CN2022/117912
§ 371 (c)(1),
(2) Date: Jan. 3, 2023

(87) PCT Pub. No.: WO2023/124224
PCT Pub. Date: Jul. 6, 2023

(65) Prior Publication Data
US 2024/0243498 A1    Jul. 18, 2024

(30) Foreign Application Priority Data

Dec. 28, 2021   (CN) .......................... 202123339321.9

(51) Int. Cl.
*H05K 1/14*          (2006.01)
*H01R 12/61*         (2011.01)

(52) U.S. Cl.
CPC .................................. *H01R 12/613* (2013.01)

(58) Field of Classification Search
CPC .. H05K 1/147; H05K 3/363; H05K 2203/167; H05K 2201/10977
See application file for complete search history.

(56) References Cited

U.S. PATENT DOCUMENTS

2008/0316255 A1* 12/2008 Kubo ..................... B41J 2/1632
                                                                   29/830
2010/0220072 A1*  9/2010 Chien ................. G06F 3/04164
                                                                  345/173

(Continued)

FOREIGN PATENT DOCUMENTS

CN      205283940 U      6/2016
CN      210983365 U      7/2020

(Continued)

*Primary Examiner* — Sherman Ng
(74) *Attorney, Agent, or Firm* — Fish & Richardson P.C.

(57) ABSTRACT

A flexible printed circuit board includes a first flexible unit and a second flexible unit, where the first flexible unit includes a first connecting portion and a plurality of first wires, and each of the first wires includes a welding point located at the first connecting portion; each of the welding points is provided with a first connecting structure, and the welding point is electrically connected to the first connecting structure; the second flexible unit includes a first face and a second face, where the first face is located on a side of the second flexible unit facing away from the first flexible unit; the second flexible unit further includes a second connecting portion and a plurality of second wires; the second connecting portion is provided with a plurality of through holes, and the plurality of through holes are provided in one-to-one correspondence to the plurality of second wires.

20 Claims, 18 Drawing Sheets

(56) References Cited

U.S. PATENT DOCUMENTS

| | | | |
|---|---|---|---|
| 2013/0314883 A1* | 11/2013 | Ling | H05K 7/026 |
| | | | 361/749 |
| 2013/0329382 A1 | 12/2013 | Jung | |
| 2016/0037638 A1* | 2/2016 | Inamori | H05K 1/116 |
| | | | 174/254 |
| 2016/0050745 A1* | 2/2016 | Liu | H05K 3/323 |
| | | | 361/749 |

FOREIGN PATENT DOCUMENTS

| | | |
|---|---|---|
| CN | 112449488 A | 3/2021 |
| CN | 213783702 U | 7/2021 |
| CN | 217116489 U | 8/2022 |
| EP | 0535491 A1 | 4/1993 |

* cited by examiner

FLEXIBLE PRINTED CIRCUIT BOARD AND ELECTRONIC DEVICE

CROSS-REFERENCE TO RELATED APPLICATIONS

This application is a national stage of International Application No. PCT/CN2022/117912, filed on Sep. 8, 2022, which claims priority to Chinese Patent Application No. 202123339321.9, filed on Dec. 28, 2021. The disclosures of both of the aforementioned applications are hereby incorporated by reference in their entireties.

TECHNICAL FIELD

This application relates to the field of communication technologies, and in particular, to a flexible printed circuit board and an electronic device.

BACKGROUND

With advantages such as high flexibility, easy bending and folding, and small thickness, flexible printed circuit boards (flexible printed circuit, FPC) have been widely used in mobile phones, tablets, and other electronic devices.

FPCs in existing electronic devices are generally an integrated structure (integrally formed). The integrally formed FPCs feature large size, difficult preparation, and high preparation costs. In addition, sizes of FPCs vary with electronic devices such that the FPCs cannot be used in other electronic devices.

SUMMARY

To resolve the foregoing technical problems, this application provides a flexible printed circuit board and an electronic device, so as to reduce preparation difficulty and preparation costs.

According to a first aspect, an embodiment of this application provides a flexible printed circuit board, where the flexible printed circuit board includes a first flexible unit and a second flexible unit: the first flexible unit includes a first connecting portion and a plurality of first wires, and each of the first wires includes a welding point located at the first connecting portion; each of the welding points is provided with a first connecting structure, and the welding point is electrically connected to the first connecting structure; the second flexible unit includes a first face and a second face, where the first face is located on a side of the second flexible unit facing away from the first flexible unit: the second flexible unit further includes a second connecting portion and a plurality of second wires: the second connecting portion is provided with a plurality of through holes, and the plurality of through holes are provided in one-to-one correspondence to the plurality of second wires; a second connecting structure is provided around a side wall of each through hole, and the second connecting structure extends to the first face and the second face and is electrically connected to the second wire; and the first connecting structure runs through the through hole and is electrically connected to the second connecting structure, so that the first wire of the first flexible unit is electrically connected to the second wire of the second flexible unit.

The flexible printed circuit board according to this embodiment of this application is formed by a combination of at least two flexible units. Smaller than the integrally structured flexible printed circuit board in size, the flexible unit features lower preparation difficulty, reduced preparation costs, and higher preparation efficiency. Moreover, a plurality of flexible units with smaller sizes being prepared on a large board facilitates layout, and improves utilization of the large board (a proportion of actually used part of the large board in the entire large board), as compared to a plurality of integrally structured flexible printed circuit boards being prepared on a large board of the same size. This avoids waste of the large board and reduces costs. This is also beneficial to reuse of the flexible units. For different electronic devices, instead of replacing the entire flexible printed circuit board, only some of the flexible units need to be replaced. Moreover, positions of the flexible units can be changed freely, allowing the flexible printed circuit board to be used more flexibly. In addition, the first connecting portion and the second connecting portion are electrically connected through electrical connection between the first connecting structure and the second connecting structure, being simple in structure.

In some possible implementations, the first connecting structure includes a first connecting sub-portion, a middle sub-portion, and a second connecting sub-portion that are connected in sequence, where the first connecting sub-portion is located between the first flexible unit and the second flexible unit, and is electrically connected to the second connecting structure located on the second face, the middle sub-portion is located inside the through hole, and is in contact with and electrically connected to the second connecting structure located in the through hole, and the second connecting sub-portion protrudes from the first face and is electrically connected to the second connecting structure located on the first face. In other words, an increased contact area between the first connecting structure and the second connecting structure facilitates electrical connection between the first connecting structure and the second connecting structure, ensuring the electrical connection between the first wire of the first flexible unit and the second wire of the second flexible unit.

In some possible implementations, the first connecting structure and the second connecting structure are electrically connected by welding. For example, the first connecting structure and the second connecting structure are electrically connected by laser welding. It should be noted that the first connecting structure and the second connecting structure are electrically connected by welding, including but not limited to laser welding.

In some possible implementations, on the basis that the first connecting structure and the second connecting structure are electrically connected by welding, in a first direction, a thickness of the first connecting sub-portion is H1, where H1 is greater than or equal to 0.02 mm and less than or equal to 0.04 mm; a thickness of the second connecting sub-portion is H2, where H2 is greater than or equal to 0.03 mm and less than or equal to 0.05 mm: where the first direction is a direction in which the first connecting portion points to the second connecting portion. When the first wire of the first flexible unit and the second wire of the second flexible unit are electrically connected by welding, the flexible printed circuit board has a small thickness, without occupying too much space of an accommodating chamber of an electronic device. This facilitates arrangement of other structures in the electronic device, helps achieve a simple structure, and reduces costs.

In some possible implementations, the flexible printed circuit board further includes an adhesive layer; and the adhesive layer is located between the first connecting portion and the second connecting portion. On the one hand, during assembly of the first flexible unit and the second flexible unit, the adhesive layer can pre-fasten the first flexible unit and the second flexible unit, preventing movement of the first flexible unit and the second flexible unit in a welding process (for example, laser welding). On the other hand, when the assembled electronic device is subjected to a large external force, such as falling, during use, arrangement of the adhesive layer allows the first flexible unit and the second flexible unit to be fastened together reliably, preventing concentration of all stress on the first connecting structure when the flexible printed circuit board is being torn in a Z-axis direction. Such concentration of stress results in separation of the first connecting structure from the welding point, and/or separation of the first connecting structure from the second connecting structure, which affects electrical connection between the first flexible unit and the second flexible unit, further affecting signal transmission.

In some possible implementations, on the basis that the foregoing flexible printed circuit board further includes an adhesive layer, and the adhesive layer is provided around a plurality of first connecting structures. An advantage of such arrangement is that the adhesive layer can fasten the first flexible unit and the second flexible unit in all directions, preventing movement of the first flexible unit and the second flexible unit and separation of the first flexible unit from the second flexible unit.

In some possible implementations, the first connecting portion is provided with a first positioning structure; the second connecting portion is provided with a second positioning structure; and orthographic projections of the first positioning structure and the second positioning structure on the first connecting portion are identical or complementary in shape. Arrangement of the first positioning structure and the second positioning structure can improve efficiency and accuracy of aligning the first flexible unit with the second flexible unit.

In some possible implementations, on the basis that the first connecting portion is provided with a first positioning structure and that the second connecting portion is provided with a second positioning structure, a minimum distance from the first positioning structure to the first connecting structure is W1, where W1 is greater than 0.5 mm; and a minimum distance from the second positioning structure to the through hole is W2, where W2 is greater than 0.5 mm. In other words, the first positioning structure is farther away from the first connecting structure, and the second positioning structure is farther away from the through hole. This avoids impact on an original structure during formation of the first positioning structure and the second positioning structure.

In some possible implementations, on the basis that the first connecting portion is provided with a first positioning structure and that the second connecting portion is provided with a second positioning structure, the first positioning structure includes a positioning rod, and the second positioning structure includes a positioning hole. The first positioning structure and the second positioning structure are simple in structure, without occupying too much space of the first connecting portion and the second connecting portion. In addition, the formation process is simple, improving preparation efficiency.

In some possible implementations, on the basis that the first positioning structure includes a positioning rod and that the second positioning structure includes a positioning hole, a minimum distance from the positioning hole to an edge of the second connecting portion is W3, where W3 is greater than 0.5 mm. In this way, during alignment of the first flexible unit 711 with the second flexible unit 712, even if the positioning rod moves in an X-axis direction or a Y-axis direction and cracks are present in the positioning hole, the cracks does not extend to an edge of the second connecting portion.

In some possible implementations, on the basis that the first positioning structure includes a positioning rod and that the second positioning structure includes a positioning hole, in a first direction, the positioning rod is cylindrical, conical or truncated cone-shaped; and in the first direction, the positioning hole matches the positioning rod in shape: where the first direction is a direction in which the first connecting portion points to the second connecting portion. When the positioning rod is conical or truncated cone-shaped, alignment efficiency can be improved.

In some possible implementations, on the basis that the first connecting portion is provided with a first positioning structure and that the second connecting portion is provided with a second positioning structure, the first positioning structure includes a positioning rod, and the second positioning structure includes a positioning slot: the second flexible unit further includes a side face connecting the first face and the second face; and the positioning slot runs through the first face and the second face, and an opening of the positioning slot is located on the side face. Because the positioning slot is located on an edge of the second connecting portion, there is no need to arrange much area in the second connecting portion for disposing the positioning slot. This can reduce a size of the second connecting portion, thereby reducing a size of the second flexible unit.

In some possible implementations, the first face and the second face each include the second wire; and in a first direction, the second wire located on the first face and the second wire located on the second face overlap, where the first direction is a direction in which the first connecting portion points the second connecting portion. In this way, a designed area of the second flexible unit is reduced. Such second flexible unit being applied to an electronic device facilitates arrangement of other structures inside the electronic device.

In some possible implementations, the flexible printed circuit board further includes an insulation layer; and the insulation layer is provided on a side of the second connecting portion facing away from the first connecting portion. Arrangement of the insulation layer can prevent the second connecting sub-portion from being short-circuited by other metal structures in the electronic device.

According to a second aspect, an embodiment of this application provides an electronic device, including the flexible printed circuit board according to any one of the foregoing implementations and capable of achieving all effects of the foregoing flexible printed circuit board.

In some possible implementations, the electronic device further includes a battery and a battery compartment for accommodating the battery; the battery compartment is provided with an accommodating groove on a side closer to the flexible printed circuit board; and the accommodating groove is configured to accommodate the first connecting portion and the second connecting portion, fully avoiding increased thickness of the device caused by overlap of the first connecting portion and the second connecting portion.

In some possible implementation, on the basis that the foregoing accommodating groove is configured to accommodate the first connecting portion and the second accommodating portion, a minimum distance from an edge of the accommodating groove to a side wall of the battery compartment is W4, where W4 is greater than or equal to 4 mm.

In other words, the accommodating groove is farther away from an edge of the battery. This avoids concentration of stress caused by the edge of the battery being located at the edge of the accommodating groove while such concentration of stress may deform the edge of the battery, and further leads to short circuit of positive and negative electrodes of the battery and causes battery safety problems.

In some possible implementations, the electronic device further includes a supporting structure; and the supporting structure is located on a side of the first connecting portion facing away from the second connecting portion. Arrangement of the supporting structure can ensure flatness for welding between the first flexible unit and the second flexible unit, avoiding undesirable welding caused by unevenness.

In some possible implementations, the electronic device further includes a heat insulation structure; and the heat insulation structure is located on a side of the first connecting portion facing away from the second connecting portion. The heat insulation structure protects the display panel, preventing the display panel from being damaged by the high temperature during welding.

REFERENCE SIGNS 10. display panel; 20. rear cover; 30. middle frame; 40. button; 50. mainboard; 60. battery; 70. FPC; 80, battery compartment;
71. flexible unit; 72, adhesive layer; 73. insulation layer; 74. supporting structure; 75. heat insulation structure; 81, accommodating groove;
711. first flexible unit; 712. second flexible unit;
7111. first face of first flexible unit; 7112. second face of first flexible unit; 7113. first connecting portion; 7114. first wire; 7115. protective layer; 7116. first connecting structure; 7117. first positioning structure; 7118. fingerprint hole; 7119. first component; 7120. second component; 7121. first face of second flexible unit; 7122. second face of second flexible unit; 7123. second connecting portion; 7124, through hole; 7125. second connecting structure; 7126. second positioning structure; 7127. side face of second flexible unit; 7116'. first connecting point;
71141. welding point; 71151. hollow portion; 71161. first connecting sub-portion; 71162. middle sub-portion; and 71163. second connecting sub-portion.

DESCRIPTION OF EMBODIMENTS

The following clearly and completely describes the technical solutions in embodiments of this application with reference to the accompanying drawings in the embodiments of this application. Apparently, the described embodiments are some but not all of the embodiments of this application. All other embodiments obtained by a person of ordinary skill in the art based on the embodiments of this application without creative efforts shall fall within the protection scope of this application.

The term "and/or" in this specification is only an associative relationship for describing associated objects, indicating that three relationships may exist. For example, A and/or B may indicate three scenarios: A alone: A and B; and B alone.

In the specification of the embodiments and the claims of this application, the terms "first", "second", and so on are intended to distinguish between different objects but do not indicate a particular order of the objects. For example, a first target object, a second target object, and the like are used to distinguish different target objects, rather than describe a specific sequence of target objects.

In the embodiments of this application, the word such as "an example" or "for example" is used to represent an example, an instance, or an illustration. Any embodiment or design solution described as "an example" or "for example" in the embodiments of this application shall not be interpreted to be more preferential or advantageous than other embodiments or design solutions. To be precise, the terms such as "an example" or "for example" is intended to present a related concept in a specific manner.

In the descriptions of the embodiments of this application. "plurality" means two or more, unless otherwise specified. For example, a plurality of processing units refer to two or more processing units, and a plurality of systems refer to two or more systems.

Figure 1:
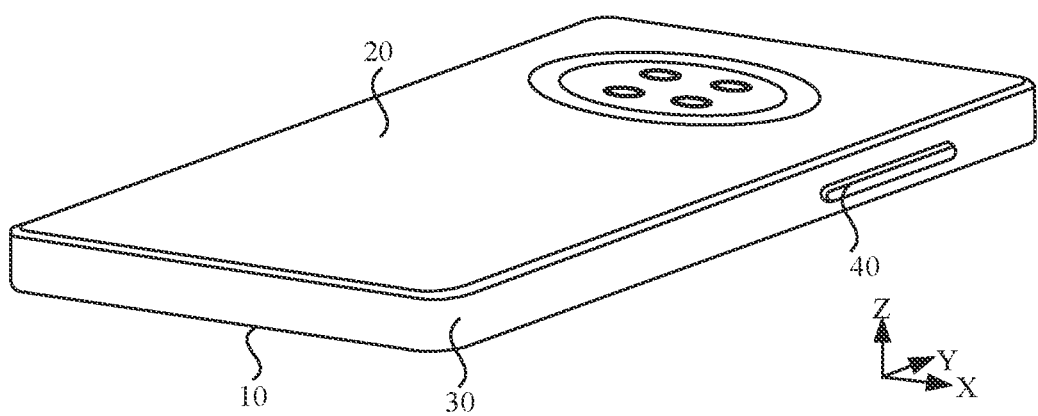
FIG. 1 is a schematic structural diagram of an electronic device according to an embodiment of this application.

An embodiment of this application provides an electronic device. The electronic device in this embodiment of this application may be an electronic device including a flexible printed circuit board (flexible printed circuit, FPC), such as a mobile phone, a computer, a tablet computer, a personal digital assistant (personal digital assistant, PDA for short), a vehicle-mounted computer, a television, a smart wearable device, or a smart home device. The embodiments of this application impose no special limitations on a specific form of the electronic device. As shown in FIG. 1, for ease of description, the following provides description by using an example in which the electronic device is a mobile phone.

It should be noted that, for clear description of subsequent structural features and a positional relationship of the structural features, an X-axis direction, a Y-axis direction, and a Z-axis direction are used to define the positional relationship of each structure in the mobile phone. The X-axis direction is a width direction of the mobile phone, the Y-axis direction is a length direction of the mobile phone, and the Z-axis direction (also known as a first direction) is a thickness direction of the mobile phone.

Figure 2:
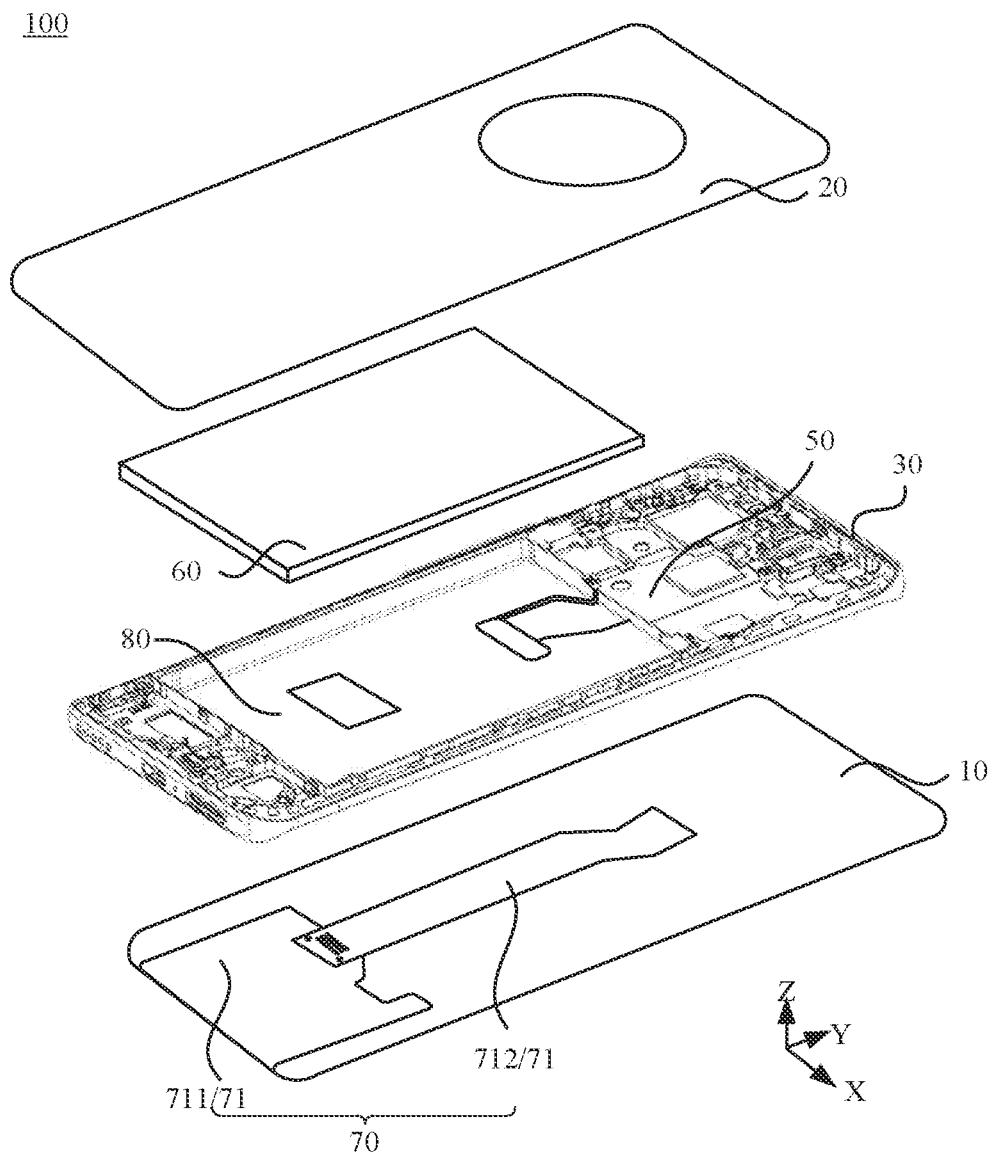
FIG. 2 is a stereoscopic exploded view of the electronic device shown in FIG. 1.

As shown in FIG. 1, the mobile phone 100 includes a display panel 10, a rear cover 20, a middle frame 30, and a button 40. The display panel 10 and the rear cover 20 are arranged opposite each other. The middle frame 30 is located between the display panel 10 and the rear cover 20. The display panel 10, the middle frame 30, and the rear cover 20 can enclose an accommodating chamber. As shown in FIG. 2, structures such as a mainboard 50, a battery 60, at least one FPC 70, a battery compartment 80 for accommodating the battery 60, and a camera lens (a front-facing camera lens and/or a rear-facing camera lens) are disposed in the accommodating chamber.

The display panel 10 includes, for example, a liquid crystal display (Liquid Crystal Display, LCD) panel, an organic light emitting diode (Organic Light Emitting Diode, OLED) display panel, and an LED display panel. The LED display panel includes, for example, a Micro-LED display panel and a Mini-LED display panel. The display panel 10 is not limited to a specific type in the embodiments of this application.

A material of the rear cover 20 may include, for example, an opaque material such as plastic, plain leather, or glass fiber, and a transparent material such as glass. The rear cover 20 is not limited to a specific material in the embodiments of this application.

The middle frame 30 is provided with a button 40. The button 40 may be a volume button for volume tuning, or a power button for wake-up and screen-off. This is not specifically limited in the embodiments of this application.

Still refer to FIG. 2. For example, the display panel 10 may be electrically connected to the mainboard 50 through the FPC 70.

It should be noted that FIG. 2 merely uses the FPC 70 connecting the display panel 10 and the mainboard 50 as an example, without constituting limitations on this application. The FPC 70 may also connect another electronic component and the mainboard 50 so as to implement electrical connection between the another electronic component and the mainboard 50. The another electronic component may be, for example, a front-facing camera lens, a rear-facing camera lens, or the button 40.

In view of the problem in the background, an embodiment of this application provides an FPC 70. The FPC 70 includes a combination of at least two flexible units. Smaller than an integrally structured FPC in size, the flexible unit features lower preparation difficulty, reduced preparation costs, and higher preparation efficiency. Moreover, a plurality of flexible units with smaller sizes being prepared on a large board facilitates layout, and improves utilization of the large board (a proportion of actually used part of the large board in the entire large board), as compared to a plurality of integrally structured FPCs being prepared on a large board of the same size. This avoids waste of the large board and reduces costs. This also facilitates reuse of the flexible units. For different electronic devices, instead of replacing the entire FPC, only some of the flexible units need to be replaced. Moreover, positions of the flexible units can be changed freely, improving flexibility in the use of the FPC 70.

The following details a specific structure of the FPC 70 with reference to the mobile phone 100. The following assumes that the FPC 70 connects the display panel 10 and the mainboard 50.

Before the description, it should be noted that the FPC 70 is not limited to a specific shape in the embodiments of this application. When the FPC 70 is applied in a same scenario (for example, for connecting the display panel 10 and the mainboard 50), a shape of the FPC 70 may be set based on an actual situation, and is not limited to the shape shown in FIG. 2. When the FPC 70 is applied in a different scenario (for example, for connecting the front-facing camera lens and the mainboard 50), a shape of the FPC 70 may be changed based on an actual situation.

Figure 3:
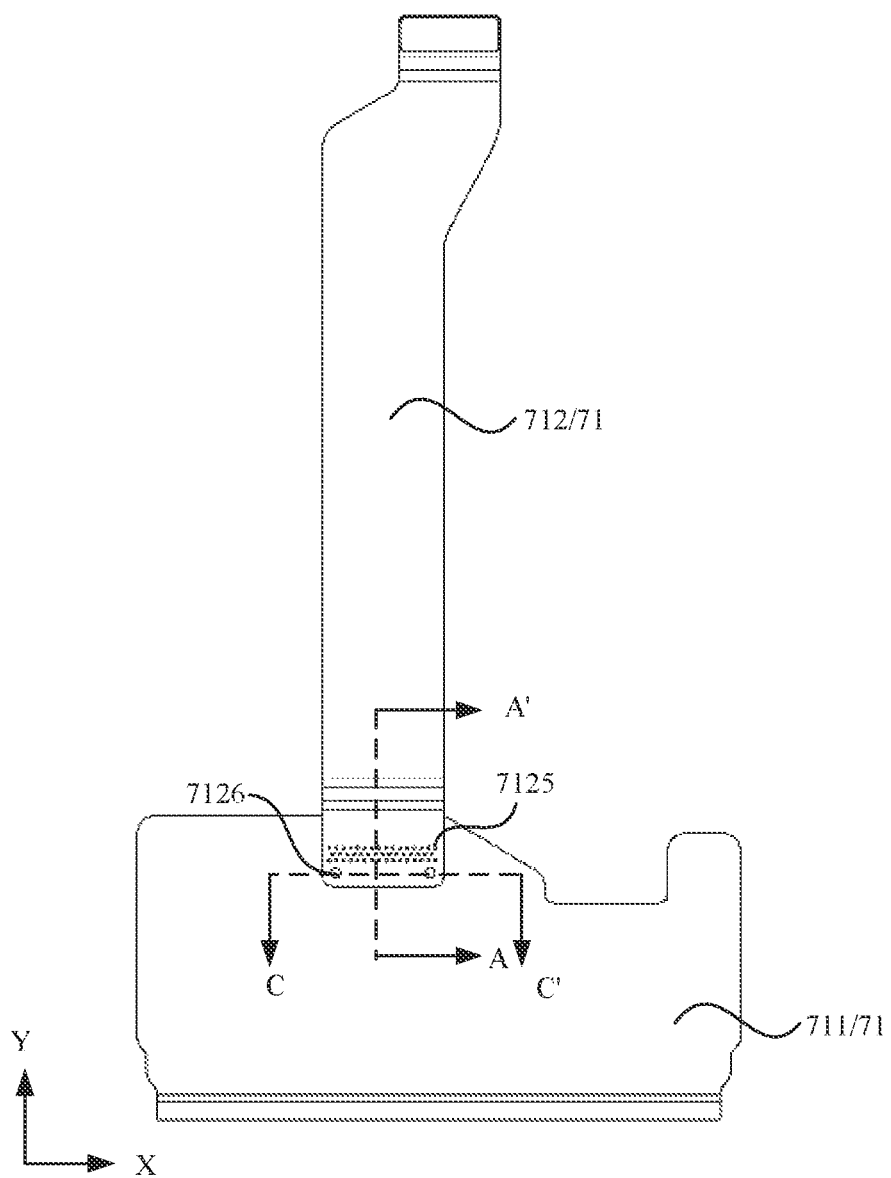
FIG. 3 is a schematic structural diagram of an FPC according to an embodiment of this application.

As shown in FIG. 2 and FIG. 3, the FPC 70 includes at least two flexible units 71, and the at least two flexible units 71 include a first flexible unit 711 and a second flexible unit 712, where the first flexible unit 711 and the second flexible unit 712 are electrically connected. The first flexible unit 711 is, for example, electrically connected to the display panel 10, and the second flexible unit 712 is, for example, electrically connected to the mainboard 50.

Figure 4:
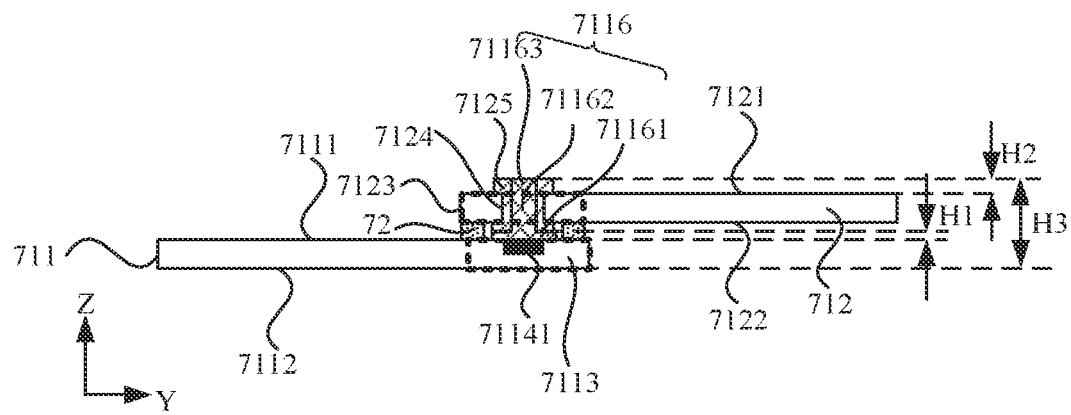
FIG. 4 is a cross-sectional view along direction AA' of FIG. 3.

As shown in FIG. 4, in a Z-axis direction, the first flexible unit 711 includes a first face 7111 and a second face 7112, and further includes a first connecting portion 7113. The second flexible unit 712 includes a first face 7121 and a second face 7122, and further includes a second connecting portion 7123. In the Z-axis direction, the first connecting portion 7113 and the second connecting portion 7123 overlap. In other words, in a thickness direction of the FPC 70, the first connecting portion 7113 and the second connecting portion 7123 intersect. To be specific, an orthographic projection of the first connecting portion 7113 on an XY plane and an orthographic projection of the second connecting portion 7123 on the XY plane overlap. In addition, the second face 7112 of the first flexible unit 711 is located on a side of the first flexible unit 711 facing away from the second flexible unit 712, and the first face 7121 of the second flexible unit 712 is located on a side of the second flexible unit 712 facing away from the first flexible unit 711.

Figure 5:
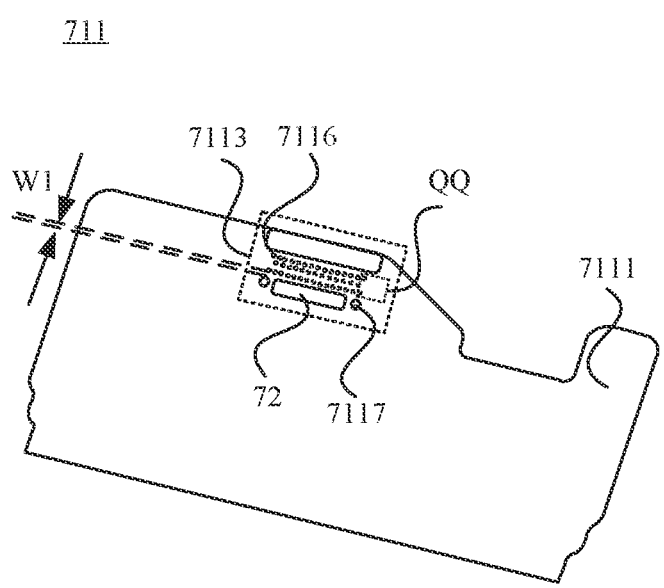
FIG. 5 is a schematic structural diagram of a first flexible unit in FIG. 3.
Figure 6:
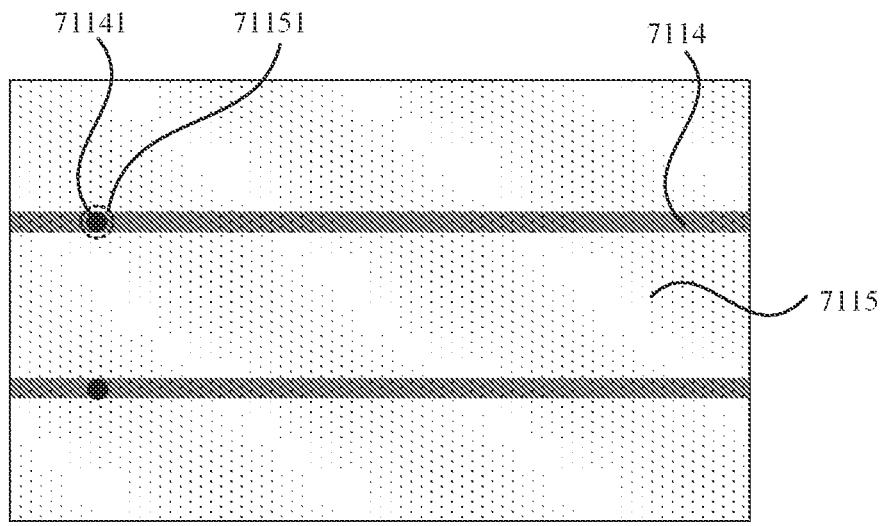
FIG. 6 is a partial enlarged view of region QQ in FIG. 5.

As shown in FIG. 5 and FIG. 6, the first flexible unit 711 includes a plurality of first wires 7114 and a protective layer 7115 that is located on the first wires 7114. The protective layer 7115 is provided with a plurality of hollow portions 71151, and the hollow portion 71151 exposes part of the first wire 7114. The part of the first wire 7114 exposed by the hollow portion 71151 is a welding point 71141.

It should be noted that, to clearly show relationship between the welding point 71141 and the first wire 7114, FIG. 6 merely shows the protective layer 7115 and the first wire 7114.

Still refer to FIG. 4 and FIG. 5. A first connecting structure 7116 is provided on a face of each welding point 71141 facing away from the first face 7111 of the first flexible unit 711. One first connecting structure 7116 is electrically connected to one welding point 71141.

Figure 7:
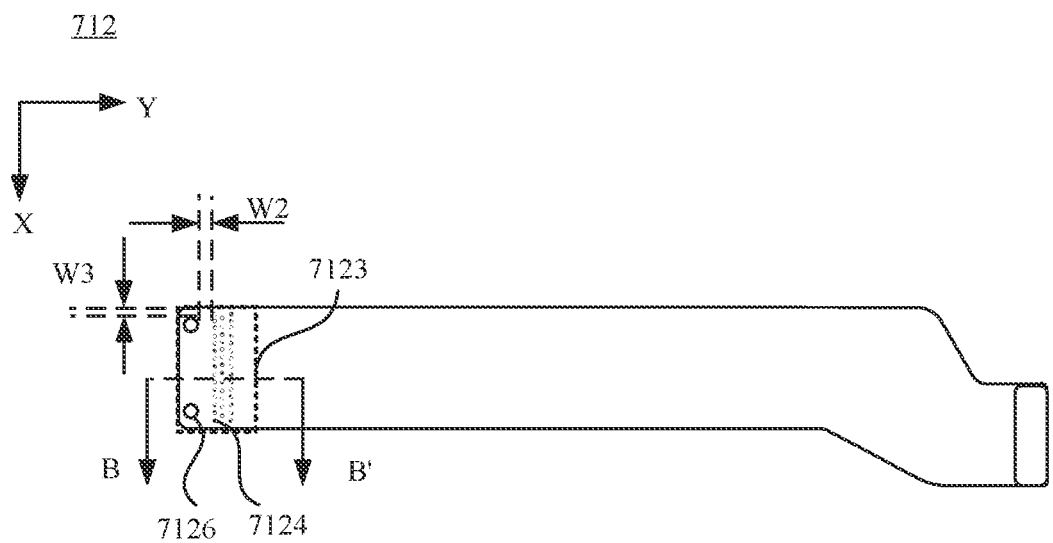
FIG. 7 is a schematic structural diagram of a second flexible unit in FIG. 3.
Figure 8:
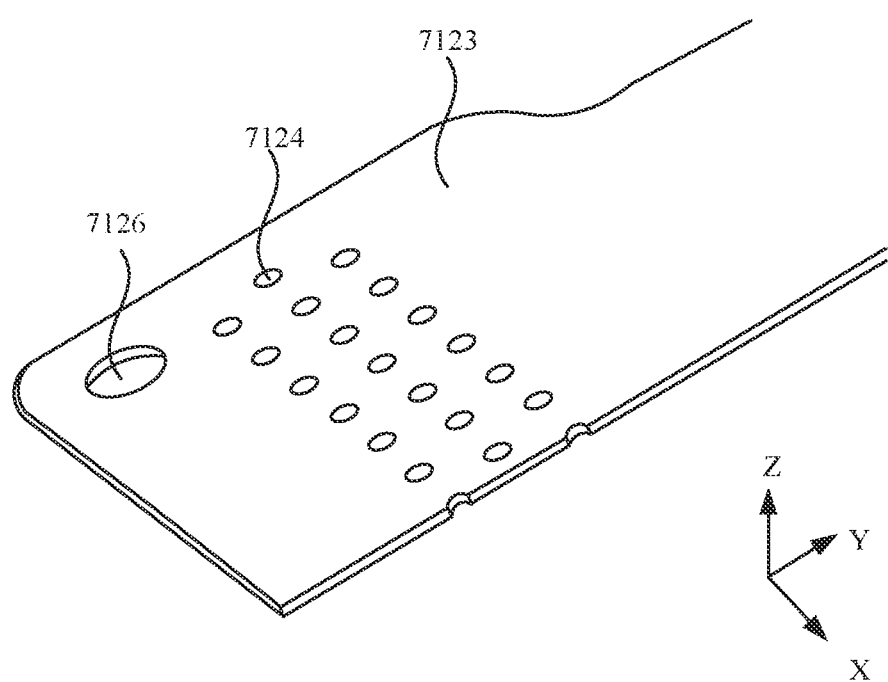
FIG. 8 is a cross-sectional view along direction BB' of FIG. 7.

As shown in FIG. 4, FIG. 7, and FIG. 8, the second connecting portion 7123 is provided with a plurality of through holes 7124. The second flexible unit 712 includes a plurality of second wires (not shown in the figure). The plurality of through holes 7124 are arranged in one-to-one correspondence to the plurality of second wires. That is, one through hole 7124 corresponds to one second wire.

As shown in FIG. 4, a second connecting structure 7125 is provided around a side wall of each through holes 7124. The second connecting structure 7125 extends to the first face 7121 and the second face 7122 of the second flexible unit 712 and is electrically connected to the second wire.

It should be noted that the second wires of the second flexible unit 712 may be located on only one face (the first face 7121 or the second face 7122); or a part of the second wires may be located on the first face 7121, and the other part of the second wires may be located on the second face 7122. When the second wire corresponding to the through hole 7124 is on the first face 7121, the extension part of the second connecting structure 7125 may be electrically connected to the second wire on the first face 7121. When the second wire corresponding to the through hole 7124 is on the second face 7122, the extension part of second connecting structure 7125 may be electrically connected to the second wire on the second face 7122. When a part of the second wires are located on the first face 7121, and the other part of the second wires are located on the second face 7122, in a Z-axis direction, the second wire located on the first face 7121 and the second wire located on the second face 7122 may overlap. In this way, a designed area of the second flexible unit 712 is reduced. Such second flexible unit 712 being applied to the mobile phone 100 facilitates arrangement of other structures in the mobile phone 100. The wires of the second flexible unit 712 being located on the first face 7121 is merely used as an example for description in this application.

Still refer to FIG. 4. The first connecting structure 7116 includes a first connecting sub-portion 71161, a middle sub-portion 71162, and a second connecting sub-portion 71163 that are connected in sequence. The first connecting sub-portion 71161 is located between the first connecting portion 7113 and the second connecting portion 7123, and is electrically connected to the second connecting structure 7125 located on the second face 7122. The middle sub-portion 71162 is located inside the through hole 7124 and is in contact with and electrically connected to the second connecting structure 7125 located inside the through hole 7124. The second connecting sub-portion 71163 runs through the through hole 7124, protrudes from the first face 7121 of the second flexible unit 712, and is electrically connected to the second connecting structure 7125 located on the first face 7121, so that the first wire of the first flexible unit 711 is electrically connected to the second wire of the second flexible unit 712.

It should be understood that when the first flexible unit 711 is being electrically connected to the second flexible unit 712, the first flexible unit 711 electrically connected to the display panel 10 may be bent to a back side of the display panel 10 (a side back to a light emitting side of the display panel 10), and then the first flexible unit 711 is electrically connected to the second flexible unit 712. Alternatively, the first flexible unit 711 electrically connected to the display panel 10 may be electrically connected to the second flexible unit 712, and then the first flexible unit 711 and the second flexible unit 712 are bent to the back side of the display panel 10. Alternatively, one end of the first flexible unit 711 may be electrically connected to the second flexible unit 712, another end of the first flexible unit 711 is electrically connected to the display panel 10, and then the first flexible unit 711 and the second flexible unit 712 are bent to the back side of the display panel 10. This is not limited in the embodiments of this application.

Figure 9:
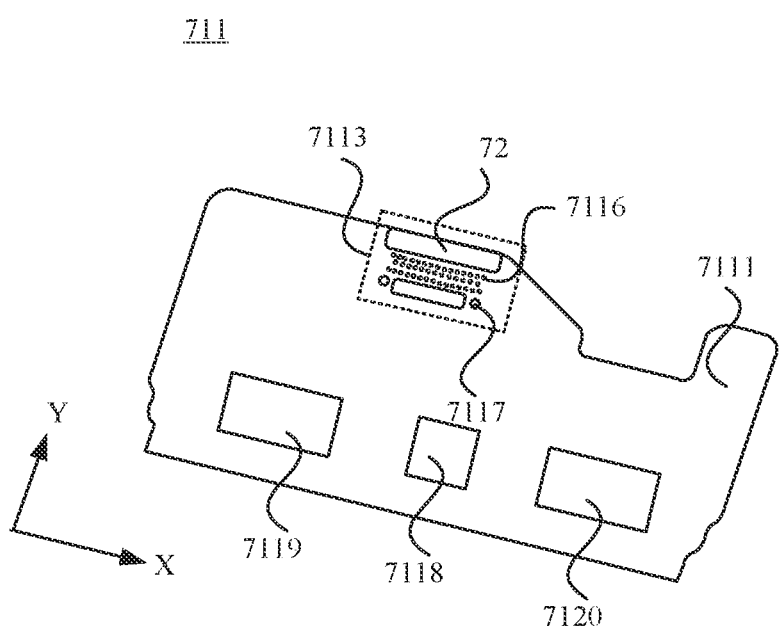
FIG. 9 is a schematic structural diagram of a first flexible unit according to an embodiment of this application.

Optionally, when the first flexible unit 711 is electrically connected to the display panel 10, as shown in FIG. 9, the first face 7111 of the first flexible unit 711 may be provided with, for example, a fingerprint hole 7118, a first component 7119, a second component 7120, and the like. A fingerprint recognition sensor may be provided in the fingerprint hole 7118 for fingerprint recognition for use of the mobile phone 100. The first component may be, for example, a display driver chip that drives a display panel 10 to display, and the second component may be, for example, a resistor and/or a capacitor.

A material of the first connecting structure 7116 is not limited in the embodiments of this application, provided that the first wire of the first flexible unit 711 and the second wire of the second flexible unit 712 can be electrically connected. For example, the material of the first connecting structure 7116 may be, for example, tin, copper, or silver.

A material of the second connecting structure 7125 is not limited in the embodiments of this application, provided that the first wire of the first flexible unit 711 and the second wire of the second flexible unit 712 can be electrically connected. The material of the second connecting structure 7125 may be, for example, copper or aluminum.

The following describes a process of electrically connecting the first wire of the first flexible unit 711 to the second wire of the second flexible unit 712. The material of the first connecting structure 7116 being tin and the material of the second connecting structure 7125 being copper are used as an example for description.

Figure 10:
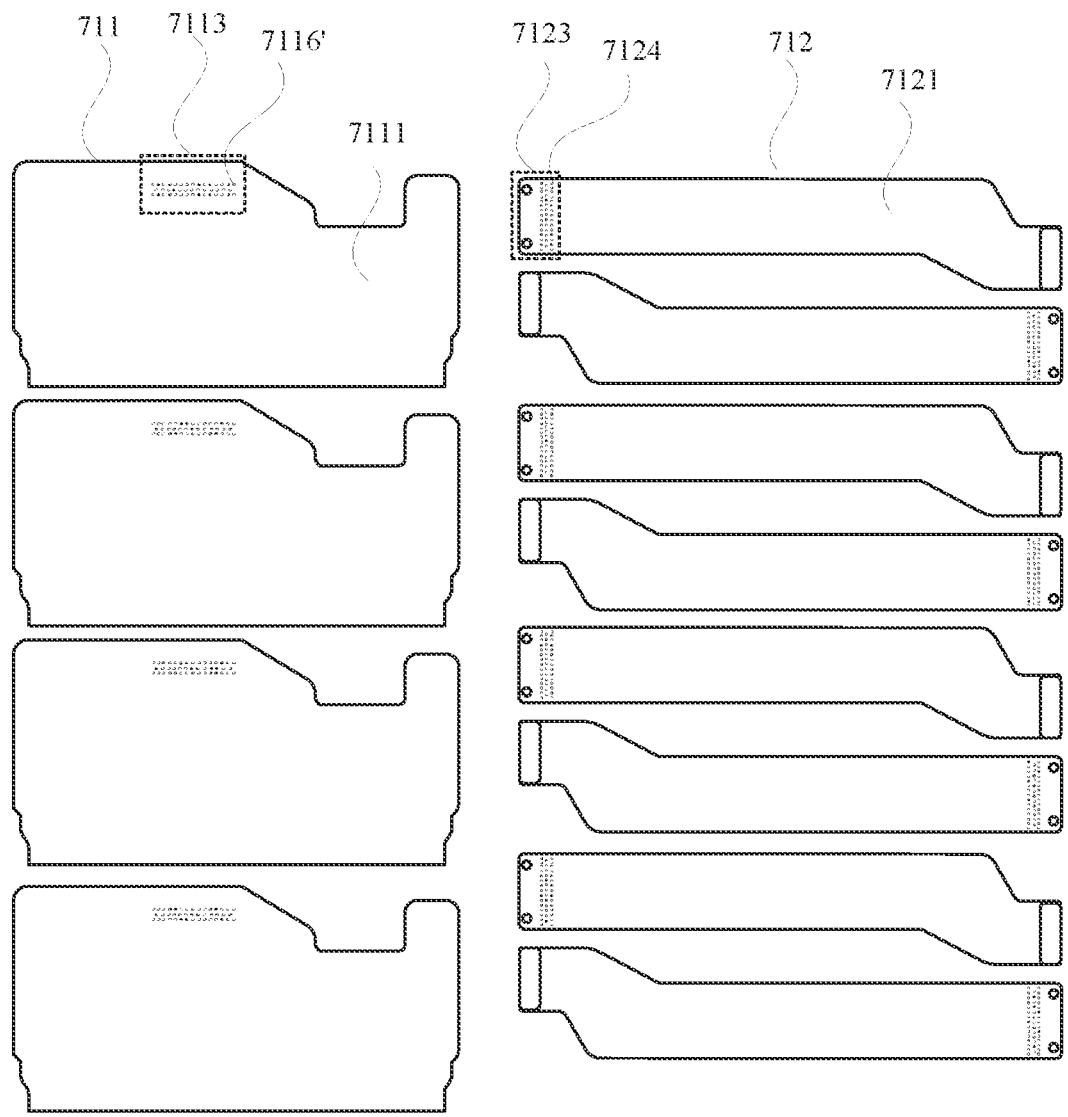
FIG. 10 is a schematic diagram of a process of preparing an FPC according to an embodiment of this application.

As shown in FIG. 10, a plurality of first flexible units 711 and a plurality of second flexible units 712 are formed on a large board. The first flexible unit 711 includes a plurality of first wires and a protective layer that is located on the first wires. The protective layer is provided with a plurality of hollow portions, and the hollow portion exposes part of the first wire. The part of the first wire exposed by the hollow portion is a welding point (not shown in FIG. 10). Each welding point is provided with a first connecting point 7116'. The first connecting point 7116' is, for example, a solder point. The second flexible unit 712 includes a plurality of second wires (not shown in the figure) and a plurality of through holes 7124 located on the second connecting portion 7123. A second connecting structure (not shown in the figure) is provided around a side wall of each through hole 7124. The second connecting structure extends to the first face 7121 and the second face 7122 of the second flexible unit 712 and is electrically connected to the second wire.

It should be noted that the first connecting point 7116' includes but is not limited to a solder point. For example, the first connecting point 7116' may alternatively be a protrusion, a cylindrical conductor, or the like.

Figure 11:
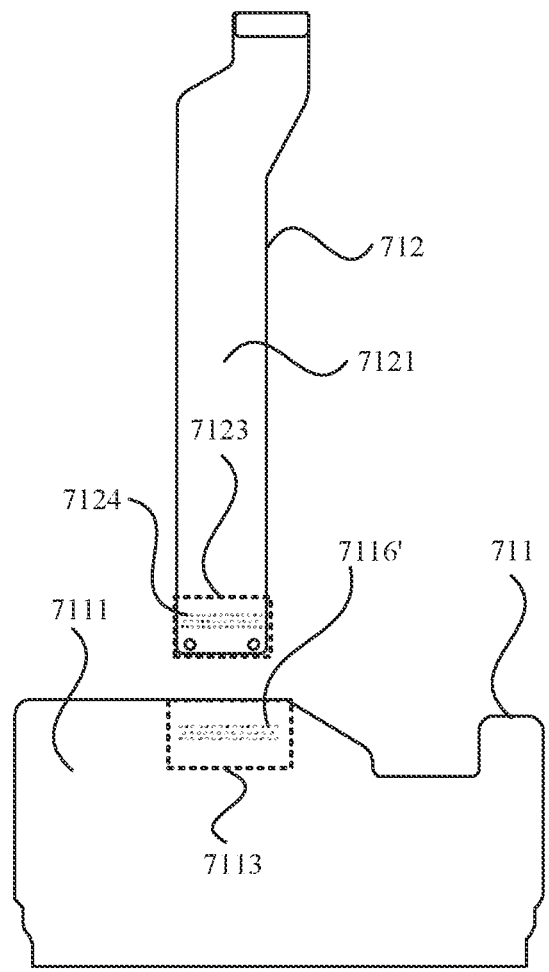
FIG. 11 is a schematic diagram of a process of preparing an FPC according to an embodiment of this application.

As shown in FIG. 11, one first flexible unit 711 and one second flexible units 712 are selected.

Figure 12:
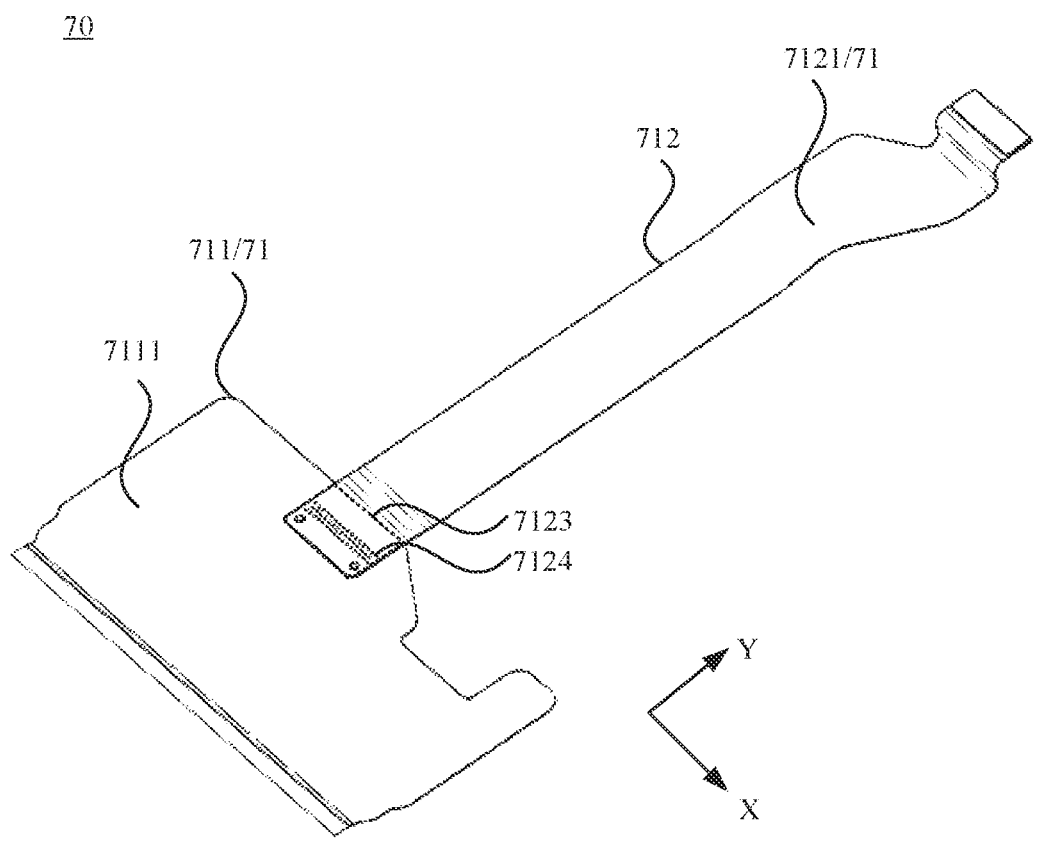
FIG. 12 is a schematic diagram of a process of preparing an FPC according to an embodiment of this application.

As shown in FIG. 12, in a Z-axis direction, the second flexible unit 712 is provided above the first flexible unit 711, with the second face 7122 of the second flexible unit 712 facing toward the first face 7111 of the first flexible unit 711. In the Z-axis direction, the first connecting portion 7113 and the second connecting portion 7123 overlap, and the through holes 7124 are provided in correspondence to the first connecting points 7116', so that the first flexible unit 711 aligns with the second flexible unit 712.

It should be noted that the through holes 7124 are provided in correspondence to the first connecting points 7116' may be: in the Z-axis direction, an orthographic projection of one through hole 7124 on the first face 7111 of the first flexible unit 711 covers one first connecting point 7116'. To be specific, in the Z-axis direction, one through hole 7124 exposes one first connecting point 7116'.

After alignment, the first flexible unit 711 and the second flexible unit 712 may be pressed together by using, for example, a transparent cover plate. The solder point may be heated and melted using laser, and the solder point flows through the through hole 7124 (the first connecting structure 7116 is formed) and is electrically connected to the second connecting structure, thereby implementing electrical connection of the first flexible unit 711 and the second flexible unit 712. In other words, the first flexible unit 711 and the second flexible unit 712 are electrically connected by laser welding, so as to form the FPC 70.

It can be learned from FIG. 10 that the flexible unit 71 is smaller than an integrally structured FPC in size, and therefore features lower preparation difficulty, reduced preparation costs, and improved preparation efficiency. Moreover, a plurality of flexible units with smaller sizes being prepared on a large board facilitates layout, and improves utilization of the large board (a proportion of actually used part of the large board in the entire large board), as compared to a plurality of integrally structured FPCs being prepared on a large board of the same size. This avoids waste of the large board and reduces costs. The beneficial effect is described below by comparison with the related art.

Figure 13:
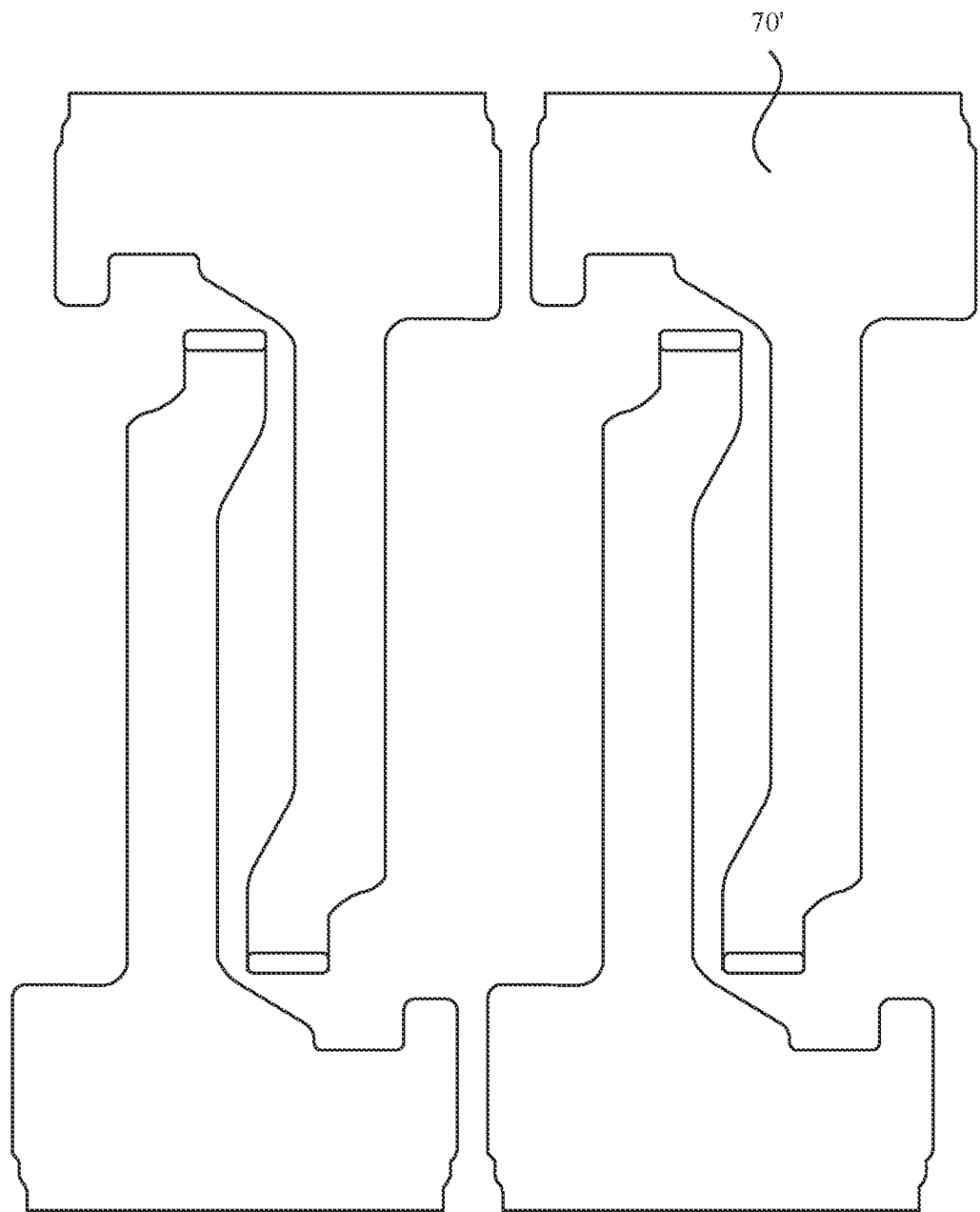
FIG. 13 is a schematic diagram of a process of preparing an FPC according to the related art.

As shown in FIG. 13, if integrally structured FPCs 70' are directly formed on a large board of the same size, four FPCs 70' can be formed. However, according to the embodiment of this application, the FPC 70 includes one flexible unit 711 and one second flexible unit 712. In such way. as shown in FIG. 10, four first flexible units 711 and eight second flexible units 712 can be formed. As compared to FIG. 13, four more second flexible units 712 can be provided. Therefore, utilization of the large board is improved, avoiding waste of the large board and reducing costs. It has been proven that the panelization rate of the FPC can be increased by more than 30%.

It should be noted that, as described above, the first flexible unit 711 may be first electrically connected to the display panel 10, and then electrically connected to the second flexible unit 712; or the first flexible unit 711 may be electrically connected to the second flexible unit 712, and then electrically connected to the display panel 10. It should be understood that for ease of description of electrical connection between the first flexible unit 711 and the second flexible unit 712, the foregoing formation process of the FPC 70 only simply shows the process of electrically connecting the first flexible unit 711 to the second flexible unit 712. No matter whether the first flexible unit 711 is first electrically connected to the display panel 10 and then electrically connected to the second flexible unit 712, or the first flexible unit 711 is first electrically connected to the second flexible unit 712 and then electrically connected to the display panel 10, a process of electrically connecting the first flexible unit 711 to the display panel 10 is not shown.

During alignment of the first flexible unit 711 with the second flexible unit 712, to improve alignment efficiency and accuracy, the first connecting portion 7113 is provided with a first positioning structure 7117, as shown in FIG. 5; and the second connecting portion 7123 is provided with a second positioning structure 7126, as shown in FIG. 7 and FIG. 8. When the second flexible unit 712 is provided above the first flexible unit 711, it is only necessary to align the first positioning structure 7117 on the first flexible unit 711 with the second positioning structure 7126 on the second flexible unit 712.

For example, the first positioning structure 7117 and the second positioning structure 7126 are identical or complementary in shape.

The so-called first positioning structure 7117 and the second positioning structure 7126 being complementary in shape means that when the first flexible unit 711 aligns with the second flexible unit 712, the first positioning structure 7117 may be located inside the second positioning structure 7126. In other words, an orthographic projection of the first positioning structure 7117 on an XY plane surrounds an orthographic projection of the second positioning structure 7126 on the XY plane: or an orthographic projection of the second positioning structure 7126 on the XY plane surrounds an orthographic projection of the first positioning structure 7117 on the XY plane.

The so-called first positioning structure 7117 and the second positioning structure 7126 being identical in shape means that when the first flexible unit 711 aligns with the second flexible unit 712, an orthographic projection of the first positioning structure 7117 on the XY plane coincides with an orthographic projection of the second positioning structure 7126 on the XY plane.

When the first positioning structure 7117 and the second positioning structure 7126 are complementary in shape, in some possible implementations, the first positioning structure 7116 is a positioning rod as shown in FIG. 5, and the second positioning structure 7123 is a positioning hole as shown in FIG. 7 and FIG. 8. When the second flexible unit 712 is provided on the first flexible unit 711, the positioning rod extends into the positioning hole.

In this case, considering that during alignment of the first flexible unit 711 with the second flexible unit 712, the positioning rod may move in the X-axis direction or the Y-axis direction. The second flexible unit 712 is thin, and the movement of the positioning rod may tear the positioning hole. In view of this, as shown in FIG. 7, the positioning hole may be provided at a position farther away from an edge of the second connecting portion 7123. To be specific, a minimum distance from the positioning hole to the edge of the second connecting portion 7123 is W3, where W3 is greater than 0.5 mm.

Figure 14:
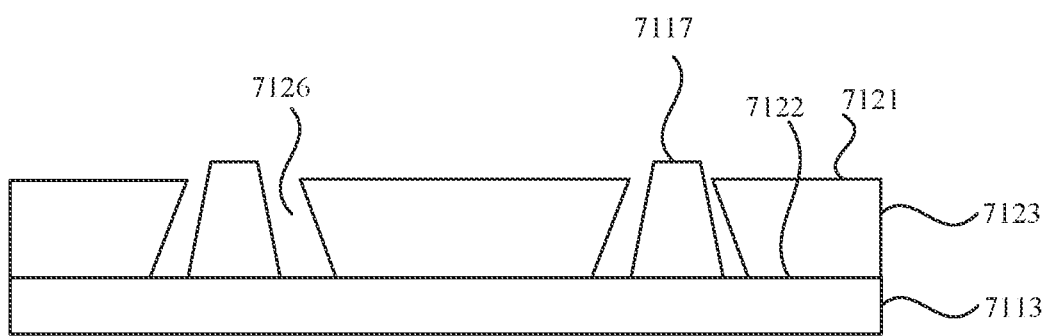
FIG. 14 is a cross-sectional view along direction CC' of FIG. 3.

In addition, in order to improve alignment efficiency, as shown in FIG. 14, the positioning rod is cylindrical, conical or truncated cone-shaped in the Z-axis direction; and in the Z-axis direction, the positioning hole matches the positioning rod in shape.

Figure 15:
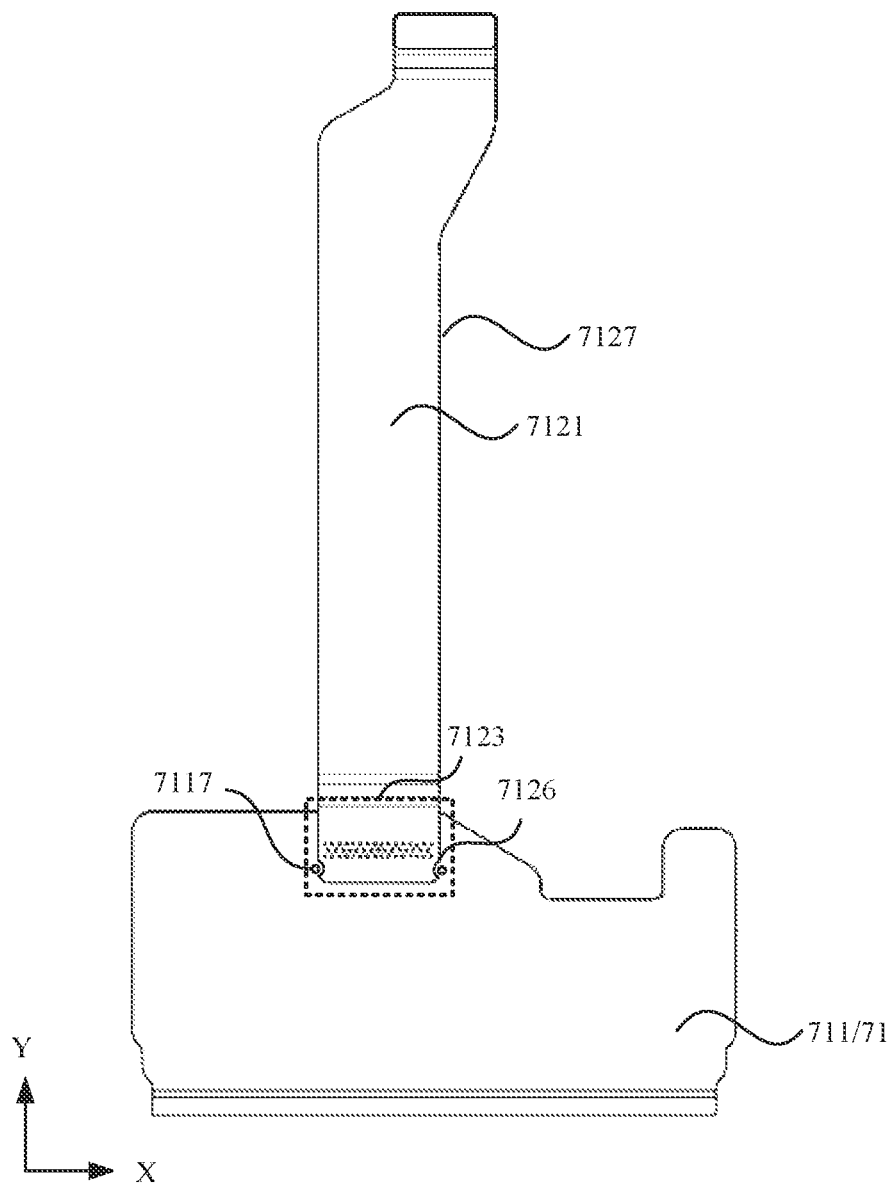
FIG. 15 is a schematic structural diagram of another FPC according to an embodiment of this application.

When the first positioning structure 7117 and the second positioning structure 7126 are complementary in shape, in some other possible implementations, as shown in FIG. 15, the first positioning structure 7117 includes a positioning rod, and the second positioning structure 7126 includes a positioning slot: the second flexible unit 712 further includes a side face 7127 connecting the first face 7121 and the second face 7122 (a face parallel to the Z-axis direction); and the positioning slot runs through the first face 7121 and the second face 7122, and an opening of the positioning slot is located on the side face 7127. Because the positioning slot is located on an edge of the second connecting portion 7123, there is no need to arrange much area in the second connecting portion 7123 for disposing the positioning slot. This reduces a size of the second connecting portion 7123, thereby reducing a size of the second flexible unit 712.

When the first positioning structure 7117 and the second positioning structure 7126 are identical in shape, in some possible implementations, the first positioning structure 7117 is a positioning hole (not shown in the figure), and the second positioning structure 7123 is also a positioning hole. When the second flexible unit 712 is provided on the first flexible unit 711, a positioning rod on a jig may be used for positioning.

When the first flexible unit 711 is provided with the first positioning structure 7117 and the second flexible unit 712 is provided with the second positioning structure 7123, a process of disposing the first positioning structure 7117 may affect a structure of the first connecting portion 7113, and a process of disposing the second positioning structure 7126 may affect a structure of the second connecting portion 7123, which in turn affect electrical connection between the first wire of the first flexible unit 711 and the second wire of the second flexible unit 712. For example, the first positioning structure 7117 is a positioning rod, and the positioning rod needs to be disposed on the first connecting portion 7113 through a welding process. However, the welding process may affect the structure of the first connecting portion 7113. The second positioning structure 7126 is a positioning hole, and an etching process needs to be used. However, the etching process may affect the structure of the second connecting portion 7123. Therefore, as shown in FIG. 5, a minimum distance from the first positioning structure 7117 to the first connecting structure 7116 is W1, where W1 is greater than 0.5 mm; as shown in FIG. 7, a minimum distance from the second positioning structure 7126 to the through hole 7124 is W2, where W2 is greater than 0.5 mm. In this way, impact on the original structures by the processes of forming the first positioning structure 7117 and the second positioning structure 7126 can be avoided.

Optionally, as shown in FIG. 4 and FIG. 5, an adhesive layer 72 may also be provided at a position where the first flexible unit 711 and the second flexible unit 712 overlap. In other words, the adhesive layer 72 is located between the first face 7111 of the first connecting portion 7113 and the second face 7122 of the second connecting portion 7123, and is configured to connect the first face 7111 of the first connecting portion 7113 and the second face 7122 of the second connecting portion 7123. In this way, during assembly of the first flexible unit 711 and the second flexible unit 712, the adhesive layer 72 can pre-fasten the first flexible unit 711 and the second flexible unit 712, preventing movement of the first flexible unit 711 and the second flexible unit 712 in a laser welding process. In addition, when the assembled mobile phone 100 is subjected to a large external force, such as falling, during use, arrangement of the adhesive layer 72 allows the first flexible unit 711 and the second flexible unit 712 to be fastened together reliably, preventing concentration of all stress on the first connecting structure 7116 when the FPC 70 is being torn in the Z-axis direction. Such concentration of stress results in separation of the first connecting structure 7116 from the welding point 71141, and/or separation of the first connecting structure 7116 from the second connecting structure 7125, which affects electrical connection between the first flexible unit 711 and the second flexible unit 712, further affecting signal transmission.

It should be noted that, as shown in FIG. 4 and FIG. 5, the adhesive layer 72 may be first disposed on the first connecting portion 7113, and then the first flexible unit 711 and the second flexible unit 712 are assembled. Alternatively, the adhesive layer 72 may be disposed on the second connecting portion 7123, and then the first flexible unit 711 and the second flexible unit 712 are assembled. Alternatively, the adhesive layer 72 may be disposed on each of the first connecting portion 7113 and the second connecting portion 7123, and then the first flexible unit 711 and the second flexible unit 712 are assembled. This is not limited in the embodiments of this application.

Figure 16:
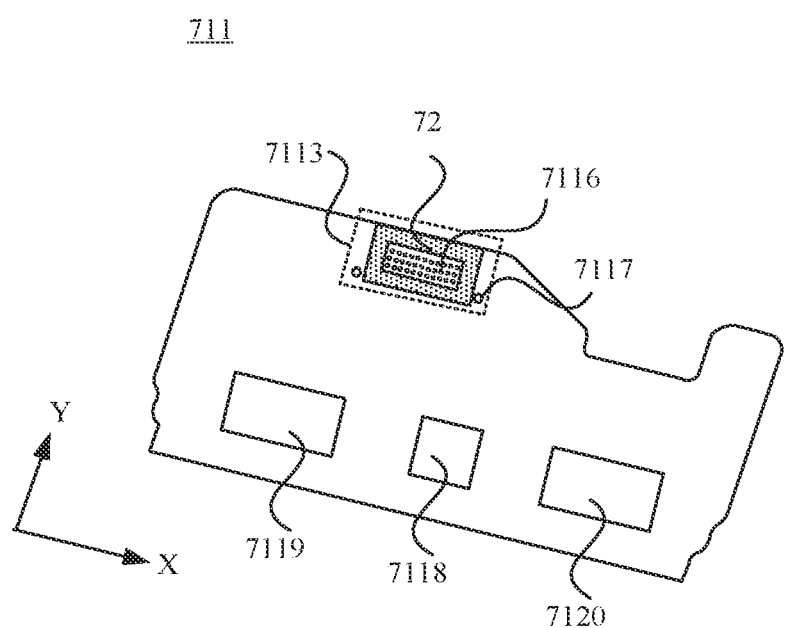
FIG. 16 is a schematic structural diagram of another first flexible unit according to an embodiment of this application.

In addition, a position for disposing the adhesive layer 72 on the first connecting portion 7113 and/or the second connecting portion 7123 is not limited in the embodiments of this application. For example, as shown in FIG. 5, when the adhesive layer is disposed on the first flexible unit 711, part of the adhesive layer 72 surrounds a plurality of first connecting structures 7116. For another example, as shown in FIG. 16, the adhesive layer 72 is disposed around the plurality of first connecting structures 7116. An advantage of such arrangement is that the adhesive layer 72 can fasten the first flexible unit 711 and the second flexible unit 712 in all directions, preventing movement of the first flexible unit 711 and the second flexible unit 712 and separation of the first flexible unit 711 from the second flexible unit 712.

A material of the adhesive layer 72 is not limited in the embodiments of this application. For example, the adhesive layer 72 may be, for example, back glue or double-side adhesive.

Figure 17:
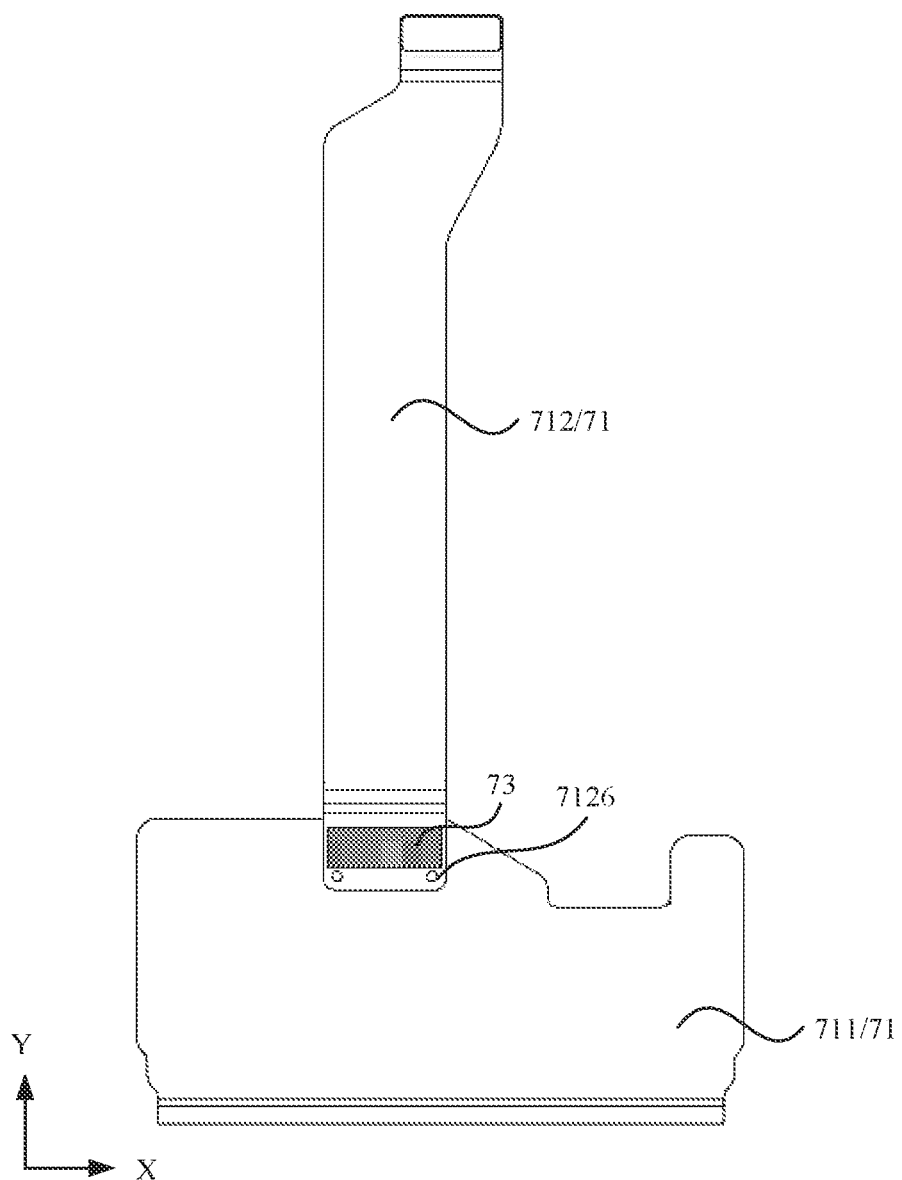
FIG. 17 is a schematic structural diagram of another FPC according to an embodiment of this application.

It can be learned from the foregoing description that the second connecting sub-portion 71163 runs through the through hole 7124, protrudes from the first face 7121 of the second flexible unit 712, and is electrically connected to the second connecting structure 7125 located on the first face 7121. This prevents the second connecting sub-portion 71163 from being short-circuited by other metal structures in the mobile phone 100. As shown in FIG. 17, the first face 7121 of the second flexible unit 712 is provided with an insulation layer 73, and the insulation layer 73 covers at least the exposed second connecting sub-portion 71163.

It can be learned from the foregoing description that, for example, the first flexible unit 711 and the second flexible unit 712 can be electrically connected by laser welding. As shown in FIG. 4, when the first flexible unit 711 and the second flexible unit 712 are electrically connected by laser welding, in the Z-axis direction, a thickness of the first connecting sub-portion 71161 is H1, where H1 is greater than or equal to 0.02 mm and less than or equal to 0.04 mm; and a thickness of the second connecting sub-portion 71163 is H2, where H2 is greater than or equal to 0.03 mm and less than or equal to 0.05 mm. The thickness of the first flexible unit 711 and the thickness of the second flexible unit 712 are both greater than or equal to 0.1 mm and less than or equal to 0.15 mm. Therefore, a thickness H3 of the first connecting portion 7113 and the second connecting portion 7123 is greater than or equal to 0.25 mm and less than or equal to 0.4 mm. As compared to that the first flexible unit 711 and the second flexible unit 712 (both have a thickness of 1.1 mm) being electrically connected using a board-to-board (board to board, BTB) connector or a zero insertion force (Zero insertion force, ZIF) connector, the FPC 70 according to the embodiment of this application has a smaller thickness, without occupying too much area of the accommodating chamber, thereby facilitating arrangement of other structures in the mobile phone 100. In addition, when the first flexible unit 711 and the second flexible unit 712 are electrically connected using a BTB connector or a ZIF connector, to prevent the connector from falling off, an additional steel plate or the like are required to fasten the connector. By contrast, this application does not require additional steel plates or the like for fastening. In this way, the structure is simple and costs can be reduced.

Figure 18:
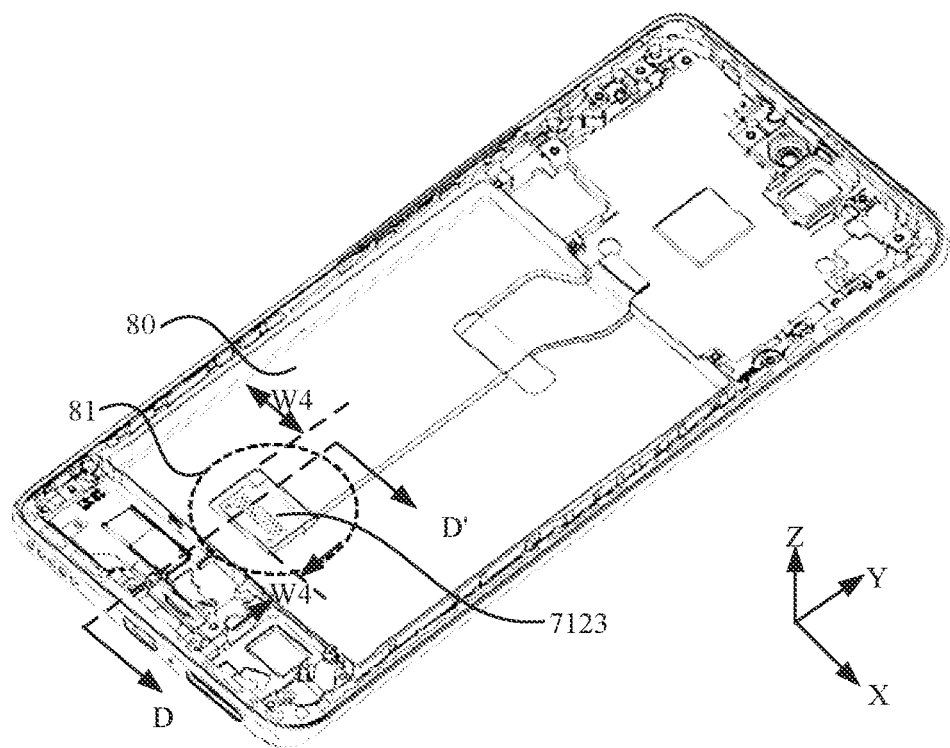
FIG. 18 is a schematic structural diagram of a display panel and a middle frame according to an embodiment of this application.
Figure 19:
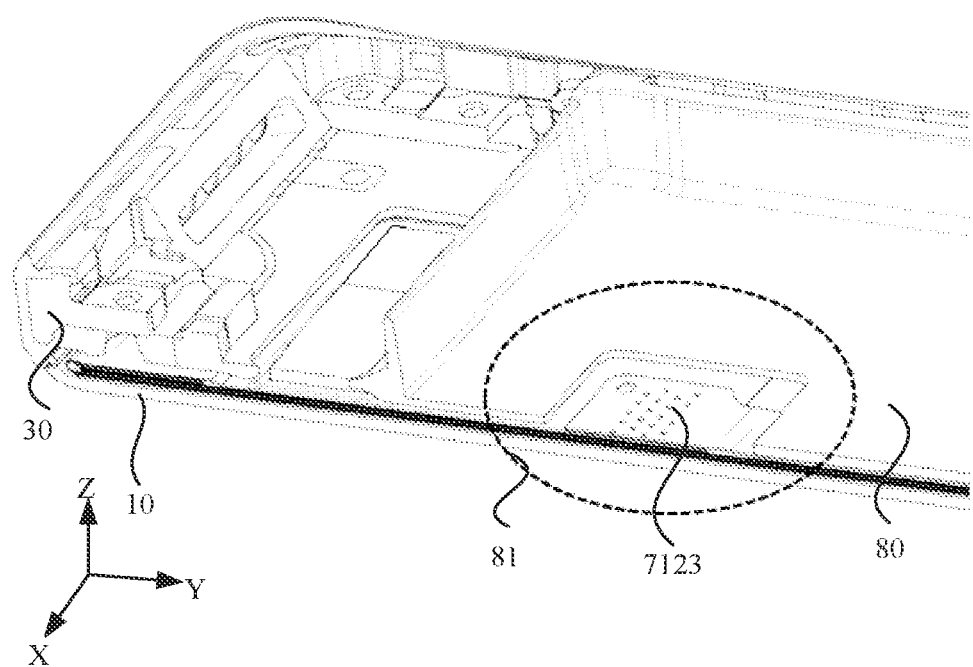
FIG. 19 is a cross-sectional view along direction DD' of FIG. 18.

In this case, to ensure that the thickness of the mobile phone 100 is not increased, as shown in FIG. 18 and FIG. 19, the battery compartment 80 is provided with an accommodating groove 81 on a side closer to the display panel 10. The accommodating groove 81 is configured to accommodate the first connecting portion 7113 and the second connecting portion 7123. In this way, in the Z-axis direction, even if the thickness of the first connecting portion 7113 and the second connecting portion 7123 is between 0.25 mm and 0.4 mm due to overlap of the first connecting portion 7113 and the second connecting portion 7123, the first connecting portion 7113 and the second connecting portion 7123 can be accommodated in the accommodating groove 81, which can fully avoid increasing the thickness of the device caused by overlap of the first connecting portion 7113 and the second connecting portion 7123.

It should be noted that, in the Z-axis direction, the accommodating groove 81 may run through the battery compartment 80, or may not run through the battery compartment 80. In FIG. 18, the accommodating groove 81 running through the battery compartment 80 is used as an example for description.

In addition, arrangement of the accommodating groove 81 leaves a step at a position of the battery compartment 80 in the accommodating groove 81. When the accommodating groove 81 is disposed on an edge of the battery compartment 80 and the mobile phone 100 is subjected to a large external force, such as falling, concentration of stress caused by the edge of the battery 50 being located on the edge of the accommodating groove 81 deforms the edge of the battery 50, which may lead to short circuit of positive and negative electrodes of the battery 50, resulting in battery safety problems. In view of this, as shown in FIG. 18, a minimum distance from the edge of the accommodating groove 81 to a side wall of the battery compartment 80 can be set to W4, where W4 is greater than or equal to 4 mm. To be specific, the accommodating groove 81 is disposed at a relatively central position of the battery compartment 80. In this way, deformation of the edge of the battery 50 due to concentration of stress caused by the edge of the battery 50 being located on the edge of the accommodating groove 81 can be avoided.

Figure 20:
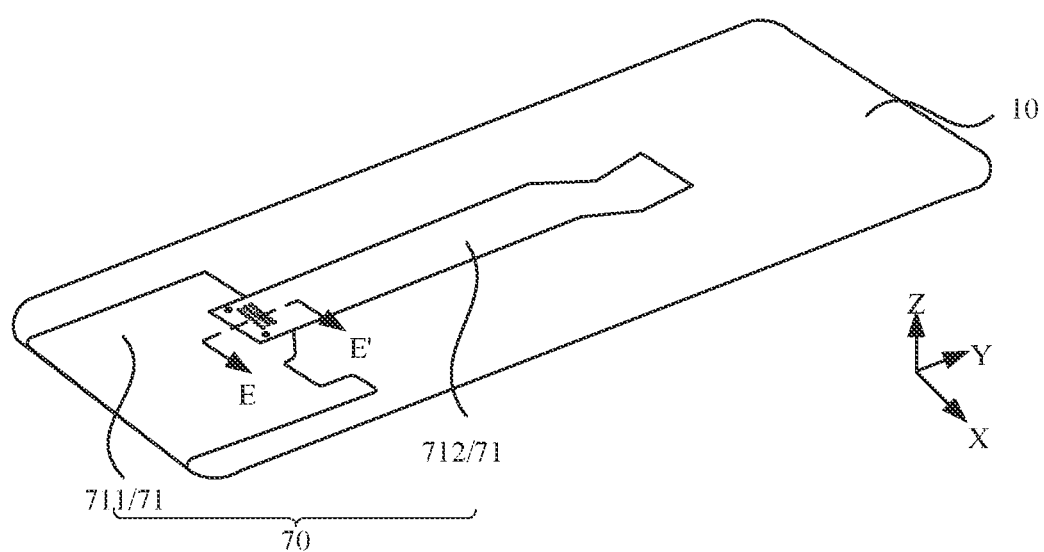
FIG. 20 is a schematic structural diagram of a display panel and an FPC according to an embodiment of this application.
Figure 21:
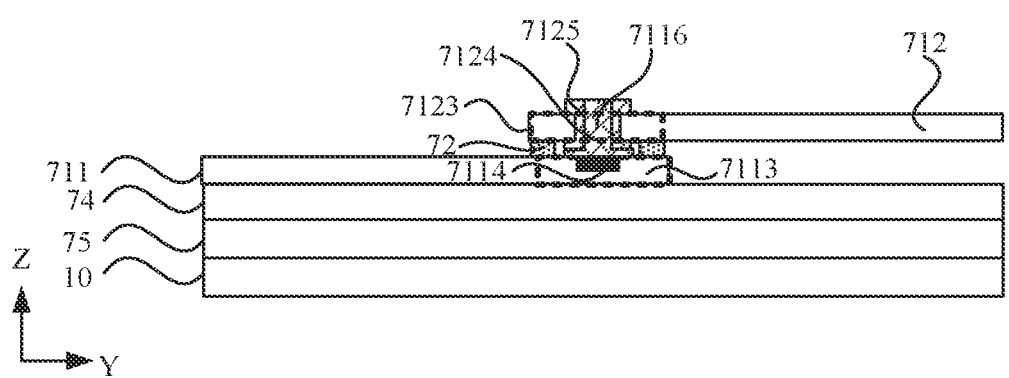
FIG. 21 is a cross-sectional view along direction EE' of FIG. 20.

When the first wire of the first flexible unit 711 and the second wire of the second flexible unit 712 are electrically connected by welding (for example, laser welding), to ensure flatness of welding between the first flexible unit 711 and the second flexible unit 712, as shown in FIG. 20 and FIG. 21, a supporting structure 74 is provided on a side of the first flexible unit 711 facing away from the second flexible unit 712. The supporting structure 74 may be, for example, fastened on the middle frame 30. When the first flexible unit 711 electrically connected to the display panel 10 is bent to the back side of the display panel 10 and then is electrically connected to the second flexible unit 712, soft structures such as foam are provided on the back side of the display panel 10, which may lead to undesirable welding, affecting electrical connection between the first flexible unit 711 and the second flexible unit 712. Arrangement of the supporting structure 74 can avoid this problem.

A material of the supporting structure 74 is not limited in the embodiments of this application, provided that such material can play a supporting role. For example, the supporting structure 74 may be, for example, steel, copper alloy, or other metal materials.

In addition, a laser welding temperature is high (up to 200° C.). Therefore, to prevent the display panel 10 from being damaged by the high temperature, as shown in FIG. 20 and FIG. 21, a heat insulation structure 75 is disposed on a side of the first flexible unit 711 facing away from the second flexible unit 712. The heat insulation structure 75 protects the display panel 10, preventing the display panel 10 from being damaged by the high temperature.

A material of the heat insulation structure 75 is not limited in the embodiments of this application, provided that the material can prevent the display panel 10 from being damaged by the high temperature. For example, the material of the heat insulation structure 75 may be, for example, a material having high temperature insulation, such as aerogel.

It should be understood that the heat insulation structure 75 may be disposed based on a welding scenario of the FPC 70. When the first flexible unit 711 electrically connected to the display panel 10 is bent to the back side of the display panel 10 and then is welded to the second flexible unit 712 by laser welding, the heat insulation structure 75 needs to be disposed on the side of the first flexible unit 711 facing away from the second flexible unit 712. When one end of the first flexible unit 711 is electrically connected to the second flexible unit 712, and then the first flexible unit 711 and the second flexible unit 712 are bent to the back side of the display panel 10, no heat insulation structure 75 needs to be disposed.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments of this application.

What is claimed is:

1. A flexible printed circuit board, comprising:
   a first flexible unit with a first connecting portion and a plurality of first wires, and
   a second flexible unit with a first face and a second face;
   wherein each of the first wires comprises a welding point located at the first connecting portion, each of the welding points is provided with a first connecting structure, and the welding point is electrically connected to the first connecting structure;
   wherein the first face is located on a side of the second flexible unit facing away from the first flexible unit;
   wherein the second flexible unit further comprises a second connecting portion and a plurality of second wires, the second connecting portion is provided with a plurality of through holes, the plurality of through holes are provided in one-to-one correspondence to the plurality of second wires, a second connecting structure is disposed around a side wall of each of the through holes, and the second connecting structure extends to the first face and the second face and is electrically connected to the second wire; and
   wherein the first connecting structure runs through the through hole and is electrically connected to the second connecting structure.

2. The flexible printed circuit board of claim 1, wherein the first connecting structure comprises a first connecting sub-portion, a middle sub-portion, and a second connecting sub-portion connected in sequence; and
   wherein the first connecting sub-portion is located between the first flexible unit and the second flexible unit, and is electrically connected to the second connecting structure located on the second face, the middle sub-portion is located inside the through hole and in contact with and electrically connected to the second connecting structure located in the through hole, and the second connecting sub-portion protrudes from the first face and is electrically connected to the second connecting structure located on the first face.

3. The flexible printed circuit board of claim 2, wherein the first connecting structure and the second connecting structure are electrically connected by welding.

4. The flexible printed circuit board of claim 3, wherein in a first direction, a thickness of the first connecting sub-portion is H1, wherein H1 is greater than or equal to 0.02 mm and less than or equal to 0.04 mm; and a thickness of the second connecting sub-portion is H2, wherein H2 is greater than or equal to 0.03 mm and less than or equal to 0.05 mm; and wherein the first direction is a direction in which the first connecting portion points to the second connecting portion.

5. The flexible printed circuit board of claim 1, wherein the flexible printed circuit board further comprises an adhesive layer; and the adhesive layer is located between the first connecting portion and the second connecting portion.

6. The flexible printed circuit board of claim 5, wherein the adhesive layer is provided around a plurality of first connecting structures.

7. The flexible printed circuit board of claim 1, wherein the first connecting portion is provided with a first positioning structure, and the second connecting portion is provided with a second positioning structure; and wherein orthographic projections of the first positioning structure and the second positioning structure on the first connecting portion are identical or complementary in shape.

8. The flexible printed circuit board of claim 7, wherein a minimum distance from the first positioning structure to the first connecting structure is W1, wherein W1 is greater than 0.5 mm; and wherein a minimum distance from the second positioning structure to the through hole is W2, wherein W2 is greater than 0.5 mm.

9. The flexible printed circuit board of claim 7, wherein the first positioning structure comprises a positioning rod, and the second positioning structure comprises a positioning hole.

10. The flexible printed circuit board of claim 9, wherein a minimum distance from the positioning hole to an edge of the second connecting portion is W3, wherein W3 is greater than 0.5 mm.

11. The flexible printed circuit board of claim 9, wherein in a first direction, the positioning rod is cylindrical, conical or truncated cone-shaped, and the positioning hole matches the positioning rod in shape; and wherein the first direction is a direction in which the first connecting portion points to the second connecting portion.

12. The flexible printed circuit board of claim 7, wherein the first positioning structure comprises a positioning rod, and the second positioning structure comprises a positioning slot;

wherein the second flexible unit further comprises a side face connecting the first face and the second face; and wherein the positioning slot penetrates through the first face and the second face, and an opening of the positioning slot is located on the side face.

13. The flexible printed circuit board of claim 1, wherein the first face and the second face each comprise the second wire; and in a first direction, the second wire located on the first face overlaps with the second wire located on the second face; wherein the first direction is a direction in which the first connecting portion points to the second connecting portion.

14. The flexible printed circuit board of claim 1, wherein the flexible printed circuit board further comprises an insulation layer; and wherein the insulation layer is provided on a side of the second connecting portion facing away from the first connecting portion.

15. An electronic device, comprising a flexible printed circuit board; wherein the flexible printed circuit board comprises:

a first flexible unit with a first connecting portion and a plurality of first wires, and a second flexible unit with a first face and a second face;

wherein each of the first wires comprises a welding point located at the first connecting portion, each of the welding points is provided with a first connecting structure, and the welding point is electrically connected to the first connecting structure;

wherein the first face is located on a side of the second flexible unit facing away from the first flexible unit;

wherein the second flexible unit further comprises a second connecting portion and a plurality of second wires, the second connecting portion is provided with a plurality of through holes, the plurality of through holes are provided in one-to-one correspondence to the plurality of second wires, a second connecting structure is disposed around a side wall of each of the through holes, and the second connecting structure extends to the first face and the second face and is electrically connected to the second wire; and wherein the first connecting structure runs through the through hole and is electrically connected to the second connecting structure.

16. The electronic device of claim 15, further comprising: a battery and a battery compartment for accommodating the battery;

wherein the battery compartment is provided with an accommodating groove on a side closer to the flexible printed circuit board, and the accommodating groove is configured to accommodate the first connecting portion and the second connecting portion.

17. The electronic device of claim 16, wherein a minimum distance from an edge of the accommodating groove to a side wall of the battery compartment is W4, wherein W4 is greater than or equal to 4 mm.

18. The electronic device of claim 15, wherein the electronic device further comprises a supporting structure; and the supporting structure is located on a side of the first connecting portion facing away from the second connecting portion.

19. The electronic device of claim 15, wherein the electronic device further comprises a heat insulation structure; and the heat insulation structure is located on a side of the first connecting portion facing away from the second connecting portion.

20. The electronic device of claim 15, wherein the first connecting structure comprises a first connecting sub-portion, a middle sub-portion, and a second connecting sub-portion connected in sequence; and wherein the first connecting sub-portion is located between the first flexible unit and the second flexible unit, and is electrically connected to the second connecting structure located on the second face, the middle sub-portion is located inside the through hole and in contact with and electrically connected to the second connecting structure located in the through hole, and the second connecting sub-portion protrudes from the first face and is electrically connected to the second connecting structure located on the first face.

\* \* \* \* \*